United States Patent [19]

Johnson

[11] 4,160,986
[45] Jul. 10, 1979

[54] BIPOLAR TRANSISTORS HAVING FIXED GAIN CHARACTERISTICS

[76] Inventor: David M. Johnson, 5509 Harvard, Lubbock, Tex. 79415

[21] Appl. No.: 710,727

[22] Filed: Aug. 2, 1976

[51] Int. Cl.$^2$ .............................................. H01L 29/72
[52] U.S. Cl. ........................................ 357/36; 357/34; 357/55; 357/86
[58] Field of Search ......................... 357/36, 34, 55, 86

[56] References Cited

U.S. PATENT DOCUMENTS

| | | | |
|---|---|---|---|
| 3,823,353 | 7/1974 | Berger | 357/40 |
| 3,896,486 | 7/1975 | Wright | 357/34 |
| 3,979,769 | 9/1976 | Houston et al. | 357/36 |
| 4,015,282 | 3/1977 | Shaw | 357/34 |

OTHER PUBLICATIONS

M. Polinsky, "Structure for Integrating Two Series..-.Diodes...," RCA TN No. 742, Jan. 1968.

*Primary Examiner*—Edward J. Wojciechowicz
*Attorney, Agent, or Firm*—Duckworth, Hobby, Allen & Pettis

[57] ABSTRACT

Disclosed is a bipolar transistor comprising a semiconductor body having first and second opposed surfaces with opposing edge surfaces and emitter, base and collector regions in the body with an emitter-base junction between the emitter and base regions and a base-collector junction between the base and collector regions. The emitter-base junction extends across the semiconductor body and terminates at the edge surfaces such that injection across the emitter-base junction is substantially uniform across the semiconductor body. In one arrangement, two collector regions are provided, one of which is coupled to the base contact in order to control the gain of the transistor.

8 Claims, 6 Drawing Figures

BIPOLAR TRANSISTORS HAVING FIXED GAIN CHARACTERISTICS

BACKGROUND OF THE INVENTION

1. Field of the Invention

The present invention relates to discrete bipolar transistors, and in particular relates to such transistors which are fabricated in a manner so as to obtain fixed, controllable gain characteristics.

2. Description of the Prior Art

Dual collector lateral PNP transistors are well known in the integrated circuit art. When one of the collectors of a dual collector lateral PNP transistor is tied back to the base of the same transistor, the current flowing out of the base and that collector closely duplicates the current flowing from the other, independent collector. Thus, if a fixed current is caused to flow through the first collector which is tied to the base, the free collector becomes a constant current source over reasonable values of load resistance.

In these integrated circuit arrangements, the two collectors generally take the form of hemispherical rings partially encircling the emitter, such that equal injection occurs across the emitter-base junction in the direction of each collector. Such devices are used quite extensively in linear integrated circuits where tight current tolerances are required.

There are also suggestions in the prior art for utilizing independent collectors in discrete Bipolar transistors. See, for example, U.S. Pat. No. 3,074,003 to Luscher; and U.S. Pat. No. 3,134,026 to Earle.

In U.S. Pat. No. 3,626,313, Zuk discloses a monolithic integrated circuit employing a dual collector arrangement, in which one collector is tied back to the base of the same transistor. A similar arrangement is disclosed in U.S. Pat. No. 3,822,387 to Mulder.

SUMMARY OF THE INVENTION

The present invention contemplates a bipolar transistor comprising a semiconductor body having first and second opposed surfaces with opposing edge surfaces therebetween. Emitter, base and first collector regions are provided in the semi conductor body with an emitter-base junction between the emitter and base regions and a base-collector junction between the base and collector regions. The emitter-base junction extends across the semiconductor body and terminates at the edge surfaces such that injection across the emitter-base junction is substantially uniform across the semiconductor body. In one embodiment of the present invention, a second collector region is provided, and a common electrical connection is made to the second collector region and the base region, such that the gain of the transistor may be determined by controlling the size of the second collector region with respect to the first collector region.

In another embodiment, the emitter base diode is utilized to provide a high conductivity path from the base region to the emitter region for current flowing in one direction therebetween. In this arrangement, the use of the emitter-base junction extending across the semiconductor body and terminating at the edge surface provides uniform injection underneath a base contact to the emitter-base diode, to also provide means for controlling the gain of the transistor.

This invention is the subject matter of a thesis presented at Arizona State University in December 1975, and entitled "A Design Analysis of a Discrete Device with Constant Current Gain".

THE DRAWING

DETAILED DESCRIPTION

Figure 1:
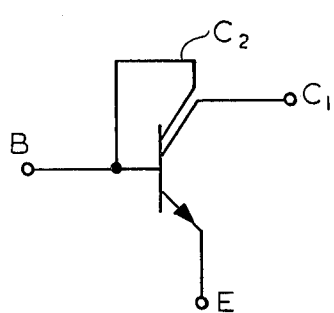
FIG. 1 is a schematic illustration of one embodiment of a transistor in accordance with the present invention.
Figure 4:
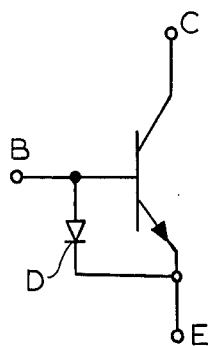
FIG. 4 is a schematic illustration of a second embodiment of a transistor in accordance with the present invention.

Several examples of transistors in accordance with the present invention will be described below with reference to FIGS. 1–6. In FIGS. 1 and 4, there is shown schematic illustrations of transistors utilizing techniques in accordance with the present invention. These schematic illustrations employ standard notation commonly used in the electronic industry. For example, the notation "E" refers to the emitter terminal, the notation "B" refers to the base terminal and the notation "C" refers to the collector terminal. As will be described in greater detail below, the example of FIG. 1 employs two collectors, and thus the notation of C1 and C2 are used to identify these two collectors. In FIG. 4, a notation "D" is used to identify a diode which appears between the base and emitter terminals of the transistor there illustrated.

It will be further understood by those skilled in the art that biasing means will be employed with each transistor arrangement to bias the respective emitter-base and base-collector junctions to achieve transistor action in the desired manner. Since such biasing techniques are well known in the art, biasing circuitry used in conjunction with FIGS. 1 and 4 is omitted.

Further, while the transistor structure shown in FIGS. 2, 3, 5 and 6 illustrate NPN transistors, it will be clear to those skilled in the art that a PNP transistor may employ the same techniques as is herein described, without departing from the spirit and scope of the invention.

I. Dual Collector

Referring to FIG. 1, a transistor in accordance with the present invention is provided with an emitter E and a base B, and is further provided with two collectors C1 and C2. In such an arrangement, the current flowing out of the second collector C2 combines with the base current, and if the base current plus collector C2 current is equal to that flowing through collector C1, the gain of the transistor will be unity.

Figure 2:
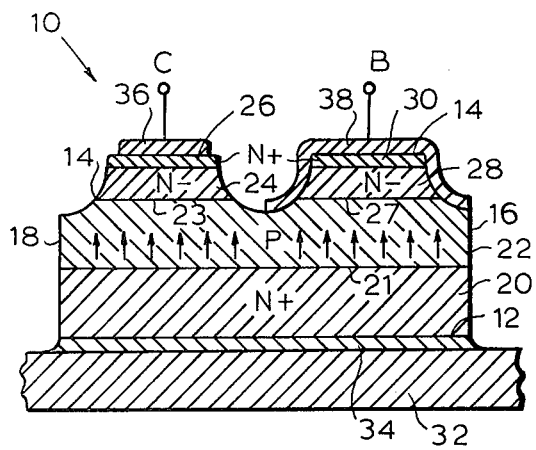
FIGS. 2 and 3 are cross sections of semiconductor devices illustrating one embodiment of the present invention.

A specific bipolar transistor structure 10 employing dual collectors, in which one of the collectors is shorted to the base, is shown in FIG. 2. This embodiment of the transistor is formed in a semiconductor body, such as silicon or germanium, having upper and lower opposed surfaces 14 and 12, respectively, and with opposing edge surfaces 16, 18 between the upper and lower surfaces. The upper surface 14 includes a plurality of mesas defined by grooves in that upper surface.

The transistor is further provided with a highly conductive N+ emitter region 20 extending across the semiconductor body 10 adjacent a P base region 22 and forming an emitter-base junction 21 therebetween. The emitter base junction 21 extends across the semiconductor body and terminates at the edge surfaces 16, 18.

In accordance with the present invention, the transistor 10 includes two collector regions adjacent to base region in forming respective base-collector junctions therebetween. A first one of the collector regions includes a highly resistive N− region 24 forming a first base-collector junction 23 with the base region 22, and further includes a highly conductive N+ region 26 extending to the upper surface 14 at the top of one of the mesas. The second collector region also includes a highly resistive N− region 28 forming a second base-collector junction 27 with the base region 22, and a highly conductive N+ region 30 extending to the upper surface 14 at the top of the other mesa.

The transistor may be disposed in a conventional package having a metallic substrate 32 to which the emitter region 20 is bonded at the lower surface 12 by a metallic layer 34.

The transistor further includes a metallic layer 36 deposited on the highly conductive N+ region 26 and forming a collector contact, as shown in FIG. 2. Additionally, another metal layer 38 is deposited on the upper surface 14 and over the highly conductive N+ region 30 forming the second collector and along the walls of the mesa in contact with the base region 22 as it extends to the upper surface 14. In this manner, the metallic layer 38 makes a shorting connection to both the second collector defined by the highly conductive N+ region 30 and the base region 22.

The transistor 10 of FIG. 1 functions in the following manner. Assuming appropriate biasing means, as described above, injection occurs across the emitter-base junction 21 in the direction of the two collector regions 26 and 30. Because the emitter-base junction 21 extends entirely across the device and terminates at the edge surfaces 16 and 18, injection occurs across the entire device. The degree of current collection at the respective first and second collector regions 26 and 30 is dependent upon the relationship of the geometry and dimensions of these collector regions. Assuming that the geometry of each of the collector regions 26 and 30 is the same, the current flowing into the N+ collector region 30 is substantially identical to the current flowing into the collector region 36. Since the second collector region 30 is shorted to the base contact 38, then that current is combined with the base current and a unity gain in the transistor is realized. It will be appreciated that the gain can be controlled by changing the relationship of the geometries of the first and second collector to achieve changes in the relationship in the respective amount of collector current flowing into the first and second collector regions 26 and 30.

Figure 3:
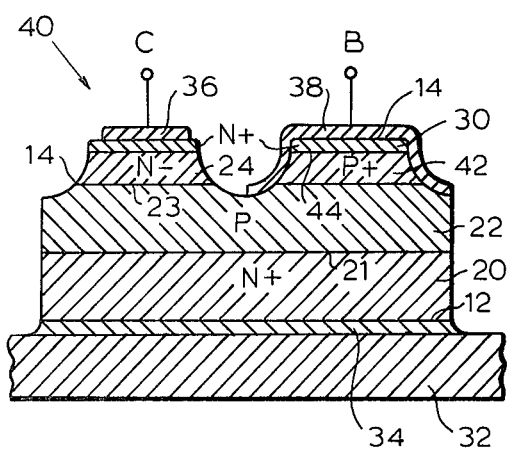

A second embodiment achieving the dual collector design in accordance with present invention is shown in FIG. 3 and referred to generally as 40. The transistor 40 is essentially identical to the transistor 10 shown in FIG. 2, in which like numerals refer to identical elements, except that a P+ region 42 is substituted for the N− region 28 in the second collector of the transistor 10, with the base metal 38 in the transistor 40 also overlapping the P+ region 42 to provide a low ohmic contact through the highly conductive P+ region 42 to the underlying base region 22. The transistor 40 includes two collector regions, and thus functions in a manner similar to that described above with respect to FIG. 2.

II. Base-Emitter Diode

A second schematic diagram illustrating another form of the present invention is shown in FIG. 4. The transistor shown in FIG. 4 includes emitter, base and collector terminals, with a diode between the base and emitter terminals. In operation, the current flowing through the diode D sets up a $V_{be}$ which establishes emitter injection to thereby obtain control over the gain of the total device in the desired manner.

Figure 5:
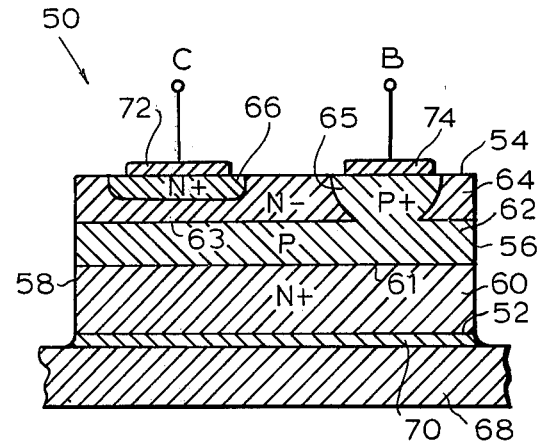
FIG. 5 is a cross section illustrating a semiconductor device incorporating the embodiment shown in FIG. 4.

A first embodiment of a transistor incorporating the design of FIG. 4 is shown in FIG. 5. This transistor, referred to generally as 50, includes upper and lower surfaces 54, 52 and opposing edge surfaces 56 and 58. It will, of course, be understood that the edge surfaces may constitute a single edge surface in the case of a circular transistor design.

The transistor 50 further includes a highly conductive N+ emitter region 60 extending across the semiconductor body and adjacent to the lower surface 52 and forming an emitter-base junction 61 with an adjacent P base region 62. In the manner described above, the emitter-base junction 61 extends completely across the semiconductor body and terminates at the edge surfaces 56 and 58.

The transistor 50 further includes an N collector region 64 extending to the upper surface 54 and forming a collector-base junction 63 with the base region 62. A highly conductive N+ collector region 66 extends into the highly resistive N− region 64.

In accordance with this invention, a highly conductive P+ region extends from the upper surface 54 through the N− collector region to the underlying base region 62. The emitter region 60 is coupled to an underlying substrate 68 via a metallic layer 70. Appropriate collector and base metal layers 72 and 74 form respective contacts for those regions.

The geometry of the transistor 50 of FIG. 5 obtains a diode between the base and emitter regions in a well known manner. However, since injection from the emitter-base junction 61 is substantially uniform across the entire semiconductor body, the amount of base current flowing through the diode D (FIG. 4), that is between the base metal 74 and the emitter contact 68 in the transistor 50 can be determined by controlling the geometry of the highly conductive P+ region 65 which extends into the base region 62 with respect to the geometry of the collector-base junction 63, which is formed by the remaining N− collector area. In this way, control over the gain of the transistors can also be realized.

Figure 6:
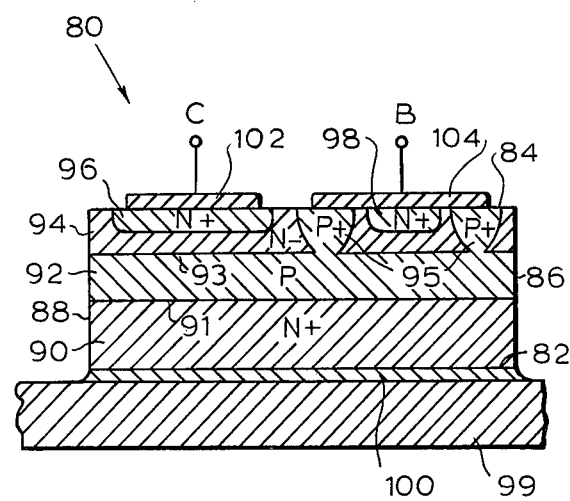
FIG. 6 is a cross section of a semiconductor body made in accordance with the present invention, and incorporating the designs illustrated in FIGS. 1 and 4.

Another embodiment of a transistor in accordance with the present invention is shown in FIG. 6 and referred to generally as 80. In this arrangement, the transistor incorporates both the dual collector and base-emitter diode arrangements which have been described above with reference to FIGS. 1–5.

Noting FIG. 6, the transistor 80 includes lower and upper surfaces 82 and 84 respectively, and opposing edge surfaces 86 and 88.

The transistor 80 includes an N+ emitter region 90 extending completely across the semiconductor body and forming an emitter-base junction 91 with an adjacent P base region 92. An N− collector region 94 extends to the upper surface 84 and the adjacent P base region 92, forming a base-collector junction 93 therebetween.

The transistor 80 further includes two collector regions 96 and 98, each being a highly conductive N+ region extending into the N− collector layer 94. The base region 92 further includes a highly conductive P+ portion encircling the second collector 98 and extending to the underlying base region 92. The emitter region 90 is in contact with a highly conductive substrate 99 via a metallic layer 100, and the first collector region 96 is contacted by a metallic layer 102 on the upper surface 84. The base contact comprises a metal layer 104 making contact across the upper surface 84 to the second collector region 98 and the highly conductive P+ portions 95 of the base region. Thus, the P+ portion 95 defines the base-emitter diode D of FIG. 4, while the second collector 98 defines the second collector C2 of FIG. 1. In this way, the transistor 80 incorporates both of the techniques described above with reference to FIGS. 1-5.

I claim:

1. A bipolar transistor comprising:
   a semiconductor body having first and second opposed surfaces with opposing edge surfaces therebetween;
   an emitter region, a base region and a first collector region in said semiconductor body with an emitter-base junction between said emitter and base regions and a base-collector junction between said base and first collection regions;
   said emitter region extending to said first surface and said emitter-base junction extending across said semiconductor body and terminating at said edge surfaces such that injection across said emitter-base junction is substantially uniform across said semiconductor body;
   said first collector region extending to said second surface;
   means for making a low ohmic collector contact to said first collection region at said second surface;
   a highly conductive substrate supporting said semiconductor body;
   means making a low ohmic emitter contact between said substrate and said first surface of said semiconductor body;
   said base region extending to said second surface;
   a second collector region in said semiconductor body and independent of said first collector region, said second collector region extending to said second surface; and
   means for making a low ohmic base contact to both said base region and said second collector region at said second surface.

2. A bipolar transistor as recited in claim 1 wherein said base contact means comprises a first metal layer on said second surface and overlying a portion of said base and second collector region on said second surface.

3. A bipolar transistor as recited in claim 2 wherein said second surface defines a plurality of mesas, a first one of said mesas defining said first collector region in said semiconductor body and a second one of said mesas including said second collector region therein.

4. A bipolar transistor as recited in claim 1 wherein said second surface comprises a substantially flat surface, and wherein said means for making a low ohmic base contact comprises a highly conductive portion of said base region extending to said second surface.

5. A bipolar transistor as recited in claim 4 wherein said low ohmic base contact further comprises a base metal layer overlying said highly conductive portion at said second surface.

6. A bipolar transistor comprising:
   a high condictivity substrate;
   a semiconductor body having first and second opposed surfaces with opposed edge surfaces therebetween;
   an emitter region of a first conductivity type in said semiconductor body and extending to said first surface, said emitter region making a low ohmic contact with a substrate at said first surface;
   a base region in said semiconductor body of a second conductivity type opposite to said first conductivity type, said base region being adjacent to said emitter region and extending to said second surface;
   means for making low ohmic contact to said base region at said second surface;
   an emitter-base junction between said emitter and base regions and extending across said semiconductor body and terminating at said edge surfaces;
   a first collector region in said semiconductor body of said first conductivity type and adjacent said base region with a first base-collector junction therebetween, said collector region extending to said second surface;
   a second collector region in said semiconductor body of said first conductivity type adjacent said base region with a second base-collector junction therebetween;
   said base region low ohmic contact means comprising a highly conductive path interconnecting said base region and said second collector region; and wherein
   injection across said emitter-base junction is substantially uniform between said edge surfaces.

7. A bipolar transistor as recited in claim 6 wherein said highly conductive path comprises a metal layer disposed on said second surface.

8. A bipolar transistor as recited in claim 6 wherein the thickness of said emitter region is substantially uniform between said edge surfaces, whereby injection across said emitter-base junction is substantially uniform in a direction towards said collector region in said base region metal layer from said second surface.

* * * * *